United States Patent
Tonti et al.

(10) Patent No.: US 6,432,809 B1
(45) Date of Patent: Aug. 13, 2002

(54) METHOD FOR IMPROVED PASSIVE THERMAL FLOW IN SILICON ON INSULATOR DEVICES

(75) Inventors: William R. Tonti, Essex Junction; Steven H. Voldman, South Burlington, both of VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/514,396

(22) Filed: Feb. 28, 2000

(51) Int. Cl.[7] .................... H01L 21/44; H01L 21/4763
(52) U.S. Cl. ................... 438/618; 438/361; 438/476; 438/612; 438/622; 438/585
(58) Field of Search ................... 438/361, 360, 438/359, 672, 675, 585, 586, 618, 611, 612, 613, 614, 617, 430, 455, 424, 405, 479, 154, 622, 620

(56) References Cited

U.S. PATENT DOCUMENTS

| | | | |
|---|---|---|---|
| 5,034,347 A | | 7/1991 | Kakihana .................. 437/187 |
| 5,299,091 A | * | 3/1994 | Hoshi et al. .............. 361/723 |
| 5,621,616 A | * | 4/1997 | Owens et al. ............. 361/704 |
| 5,798,297 A | * | 8/1998 | Winnerl .................... 438/622 |
| 5,811,352 A | | 9/1998 | Numata et al. ........... 438/622 |
| 5,880,010 A | | 3/1999 | Davidson ................. 438/455 |
| 5,896,271 A | | 4/1999 | Jensen et al. ............. 361/719 |
| 5,902,120 A | | 5/1999 | Igel et al. ................. 438/113 |
| 5,955,781 A | * | 9/1999 | Joshi et al. ............... 257/712 |
| 6,146,982 A | * | 10/2000 | Werner et al. ........... 438/586 |

* cited by examiner

Primary Examiner—Tuan H. Nguyen
Assistant Examiner—Thanhha Pham
(74) Attorney, Agent, or Firm—Whitham, Curtis & Christofferson, P.C.; Mark F. Chadurjian

(57) ABSTRACT

Increased heat dissipation is provided in a high performance integrated circuit by providing a thermally conductive path from a thermal poly plug (TPP) which extends through a thermal barrier in the substrate, such as in insulator layer of a silicon-on-insulator layer, to a front surface of the chip simultaneously with formation of active device contacts through an insulator layer of said chip. A pad is formed in thermal contact with said thermally conductive path simultaneously and coplanar with wiring connections to active device contacts and a further thermally conductive path may be formed through wiring and/or further insulator layers to a pad for attachment of a passive heat sink or active cooling device coplanar with wire bond pads at a surface of the wiring and/or further insulator layers. Electrical connections to the wire bond pads are formed through optionally insulated apertures in the passive heat sink or active cooling device. Enhancements to heat transfer are provided by removing insulator at the bottom of the YPP and simultaneous formation with portions of active devices.

18 Claims, 2 Drawing Sheets

METHOD FOR IMPROVED PASSIVE THERMAL FLOW IN SILICON ON INSULATOR DEVICES

BACKGROUND OF THE INVENTION

1. Field of the Invention

The present invention generally relates to high performance semiconductor integrated circuit devices and, more particularly, to passive heat transfer structures therein, especially integrated circuits formed on silicon-on-insulator substrates.

2. Description of the Prior Art

Recent advances in integration density of integrated circuit devices have resulted in decreased signal propagation times and shorter operation cycle times in integrated circuits as well as improved noise immunity and economy of manufacture. However, increased switching rates and integration density engender greater power dissipation per unit area of an integrated circuit chip. As is well-recognized in the art, power dissipation is increased during the short but finite turn-on and turn-off times of both bipolar and field effect transistors. Additionally, peripheral circuits, electrostatic discharge (ESD) circuits (which develop large currents from the discharge) such as off-chip drivers and clocks (which must accommodate large fan-out) require good thermal transport to avoid thermal failure.

In an effort to obtain improved transistor performance through reduced source/drain capacitance allowing higher switching speed or lower voltage operation or a combination of the two, silicon-on-insulator (SOI) wafers/substrates have recently become a technology of choice for many types of devices such as processors, analog circuits and dynamic memories. Such substrates generally include a so-called "handling substrate" of bulk silicon to provide a sufficient degree of mechanical robustness to withstand processing and packaging of integrated circuits.

The composition of the handling substrate is of reduced importance since it is covered with a relatively thick layer of insulator (generally an oxide on the substrate material) and another layer of high purity silicon (hereinafter referred to as the "active layer") on and/or in which the active devices of the integrated circuit are formed. Although the electrical properties of the handling substrate are substantially unimportant since the active device structures are generally separated therefrom by the thick insulator layer, the thermal properties are important for SOI devices, particularly for the types of circuits for which they are most advantageously employed.

However, the thick insulator layer is a relatively poor conductor of heat compared to the high thermal conductivity of silicon and metals and presents a substantial thermal barrier to heat transfer to the handling substrate. Likewise, the active devices are covered with a number of layers of insulator and a passivation layer of insulator which also presents a barrier to heat transfer. Therefore, power dissipation is substantially limited to paths to the surface of the integrated circuit through conductive vias which form contacts to the active regions formed in the silicon layer on the insulator. These heat conduction paths (only slightly supplemented by heat transfer through the insulators to the front and back sides of the chip) have been found insufficient to maintain adequately low temperatures of SOI integrated circuits having high performance SOI devices integrated at high density thereon.

A partial solution to improving heat dissipation from SOI chips is disclosed in U.S. patent application Ser. No. 09/514, 106, filed concurrently herewith, now U.S. Pat. No. 6,288, 426, assigned to the assignee of the present invention and hereby fully incorporated by reference. As disclosed therein, a thermal poly plug (TPP), insulated from the silicon of the active layer and the handling substrate by a thin insulator, is formed through the thick insulator layer of the SOI structure. The thin insulator and substantial peripheral area of a TPP provides a path of low thermal resistance between the silicon active layer and the silicon handling substrate. A plurality of TPPs can be distributed as desired throughout a chip design to regulate temperature variation across the chip. An area comparable to that required for one to three transistors is adequate to provide a substantial thermal path equivalent to several hundred times that area through the thermal barrier of the thick insulator.

Thus the back side of the chip also is provided for dissipation of heat although the amount of heat conducted through an array of TPPs may be limited by the area required for their formation and which is thus unavailable for the formation of active devices of the integrated circuit. Further, the back side of the chip is usually used to support the chip in a lead frame or other portion of the packaging structure and the amount of heat that can be dissipated therefrom is usually somewhat limited as well. Therefore, while TPP structures may greatly increase the heat dissipation properties of a chip, there is no assurance that the heat dissipation will be adequate to the integrated circuit design. No technique of further increasing heat transfer from the active layer of a SOI integrated circuit has heretofore been proposed, other than increasing the number of TPPs included in the chip design with consequent reduction in density of active devices and loss of functionality and performance.

SUMMARY OF THE INVENTION

It is therefore an object of the present invention to provide an additional heat transfer enhancement for integrated circuit chip and SOI chips, in particular.

It is another object of the invention to provide a heat transfer structure which is compatible with passive heat sinks and active cooling devices.

In order to accomplish these and other objects of the invention, a method of fabricating a semiconductor device having increased heat dissipation properties is provided including the steps of forming a recess in a substrate, filling the recess with a thermally conductive material to form a plug, forming active devices at a surface of the substrate adjacent the plug, applying an insulator layer over the active devices and the plug, and forming a thermally conductive path from the plug through the insulator layer to a surface of the insulator layer.

In accordance with another aspect of the invention, a semiconductor device is provided comprising a substrate having a thermal barrier below an active device region, an insulator layer overlying the active device region, a thermally conductive plug insulated from the active device region and extending through the thermal barrier, and a thermal conductor structure extending from the thermally conductive plug through the insulator layer overlying the active device region. Additional thermal conductor structures may be added to extend through other insulator layers to heat sinks.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
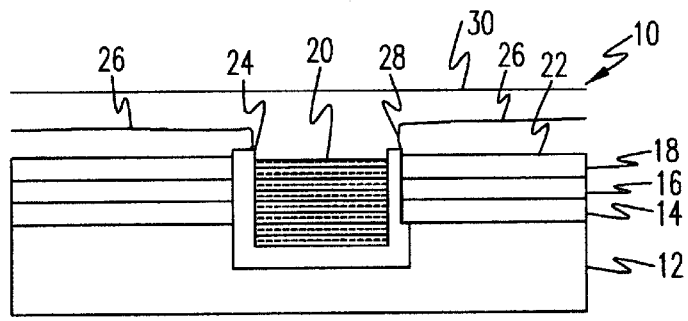
FIG. 1 is a cross-sectional view of the structure of a TPP in accordance with the invention of the above-incorporated application.

Referring now to the drawings, and more particularly to FIG. 1, there is shown, in cross-sectional view, a SOI structure 10 including a thermal poly plug (TPP) 20. It is to be understood that while the invention provides a heat transfer enhancement to a general form of this structure, no portion of this Figure is admitted to be prior art as to the present invention. FIG. 1 further illustrates a polish stop 22 in accordance with the present invention, as will be discussed below.

As is well-understood in the art, a SOI structure includes a handling substrate 12 of bulk silicon overlaid by a thick insulator layer 14 followed by a high purity silicon active layer 16 in and/or on which active devices are formed by conventional techniques familiar to those skilled in the art. The active layer is followed by an interlayer dielectric (ILD) layer 18 which may, in practice, comprise multiple layers. In accordance with the invention, it is preferred to further provide a hard polish stop layer 22 (preferably of nitride) over the ILD layer. This layer may be omitted if the interlayer dielectric (ILD) is comprised of a hard material layer such as silicon nitride titanium nitride or the like.

Figure 1A:
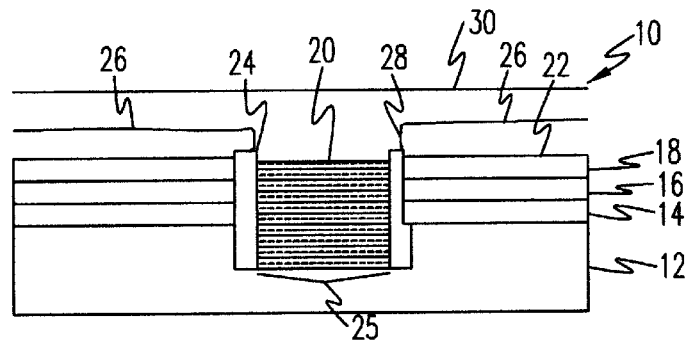
FIG. 1A is a cross-sectional view of a variant for of the structure of a TPP providing a connection to the back side bulk silicon and of improved thermal performance.

To form the TPP structure, a resist layer 26 is applied over the ILD layer 18 or the polish stop layer 22, if used, and lithographic exposure and development performed to pattern the resist as indicated at 28. The SOI structure is then etched by any of a plurality of processes well-known to those skilled in the art to provide a recess in the SOI structure to the bulk silicon layer 12. Etching into the bulk silicon is performed as a timed etch after a returned detection signal (e.g. a change in the optical spectrum with change of etched material) changes from the ILD to the bulk silicon. The timed etch can be optimized to increase the surface area of the interface between the bulk silicon and the TPP. A thin insulator layer 24 is then isotropically deposited or, preferably, thermally grown within the recess. A spacer etch process may then be optionally applied to remove the oxide at the bottom of the recess as indicated at 25, allowing direct contact of the bottom of the TPP with the back side bulk silicon as shown in FIG. 1A, illustrating a variant form of the invention. This may be performed by a masked or unmasked process depending upon the selectivity of the etch between the materials of layer 22 and 24. In the preferred embodiment of the invention, relatively great selectivity is available between nitride and oxide with processes well-understood in the art.

A polysilicon layer of sufficient thickness to fill the recess is then deposited and patterned by polishing back to the polish stop layer 22 or ILD layer 18 which also serves to planarize the surface of the structure. The polish stop layer 22 may then be removed or patterned as dictated by further processing to form active devices in and/or on active layer 16 surrounding (e.g. to the right and left in FIG. 1) of TPP 20. After the active devices are formed, insulator or passivation layers 30 may be applied and opened where necessary for formation of connections 32 (FIG. 2) to the active devices.

It should be noted that the TPP so formed has substantial lateral area within silicon active layer 16 and ILD layer 18 in front and behind the plane of the page of FIG. 1. Further, the thin insulator 24, particularly if thermally grown, can be limited to a thickness of a few hundred Angstroms or less. This is sufficient to maintain electrical isolation between the silicon active layer 16 and the bulk silicon substrate 12 and is thus only a very small fraction of the thickness of insulator layer 14. Therefore, a heat transfer path of low thermal resistance is formed between the silicon active layer 16 and the bulk silicon substrate 12, effectively shunting the high thermal resistance path through thick insulator layer 14. As noted above, the low thermal resistance of this path may be enhanced by optimization of the area of the TPP/bulk silicon interface, minimizing the thickness of sidewall insulator 24 and/or removal of the insulator at the bottom of the TPP.

It should also be noted that the above-described process resulting in the structure illustrated in FIG. 1 is quite similar to current processes for forming isolation structures, differing principally by filling the recess within insulator 24 with polysilicon rather than a dielectric such as spin-on glass. In this regard, the TPP also provides an effective isolation structure and may be employed wherever an isolation structure is required in the design, thus minimizing the effective net area required for an effective TPP function to carry the required thermal flux beyond that required for electrical isolation. In contrast, the structure of FIG. 1A does not provide isolation but provides improved thermal performance and a structure by which an electrical connection can be made to the back side bulk silicon.

Figure 2A:
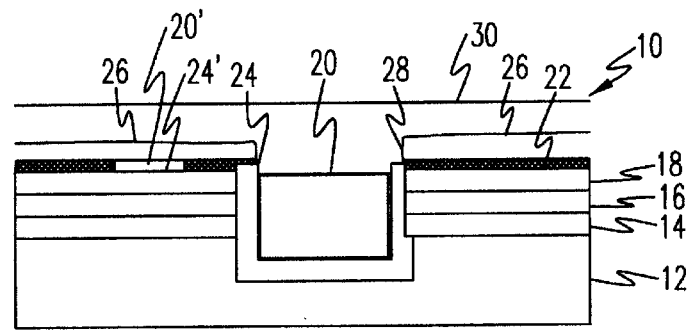
FIG. 2A is a cross-sectional view of a second embodiment of the invention.

It should additionally be appreciated that, as described above, it is preferred to form the TPP structure prior to formation of the active device since the TPP structures may be used as large registration marks and also possibly serve for self-aligned processes therebetween and since many integrated circuit formation processes are generally facilitated by formation of active devices between isolation structures; the function of which may be performed by TPP structures. However, if dictated by other process constraints, the TPP structures can be formed after formation of the active devices or at various points during active device formation. For example, the TPP may be formed in conjunction with the active gate region. If the gate insulator is again a hard layer, the TPP etch will be stopped appropriately and the gate polysilicon and TPP may be formed of the same material in the same process step, resulting in the structure illustrated in FIG. 2A. The structure also has the advantage that the resulting gate is formed as a Damascene gate which is of improved robustness and dimensional regularity.

Figure 2:
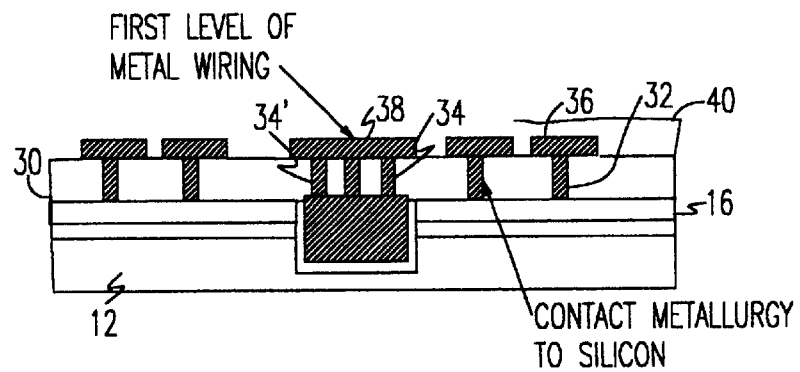
FIG. 2 is a cross-sectional view of a first embodiment of the present invention.

Referring now to FIG. 2, a first embodiment of the present invention will now be described. After formation of insulator or passivation layer(s) 30, an additional resist is applied and patterned to form contact vias 32 which are then filled with metal and metal connections 36 formed in accordance with techniques well-understood in the art. In accordance with the invention, however, a plurality of additional openings 34 and vias 34' are simultaneously formed over the TPP structure. Alternatively, a single larger opening and metal via can be formed by the same process steps. A metal heat conductor/radiator 38 can be formed simultaneously with electrical conductors 36. Accordingly, it should be appreciated that these structures are essentially "free" since they require only the same process steps as are required to form openings 34, vias 34 and electrical conductors 36; the difference being in the additional patterning of the resist applied over layer 30.

Thus it is seen that the provision of metal vias or studs 34' provides a good thermal path from the TPP to the front side of the chip which supplements the heat transfer obtained through the TPP to the bulk silicon layer 12 and the back side of the chip and directly from the active devices through electrical connections made thereto. It should be recalled that, even though a passivation layer 40 may be applied over the conductors and may reduce potential passive heat flow, the passivation layer can be made quite thin to limit thermal resistance while heat transfer from the back of the chip may be somewhat restricted by packaging structures. Thus, the invention provides a very significant degree of supplemental heat dissipation for the chip beyond that of the structure of FIG. 1 which is comparable to but generally greater than the amount of heat which can be dissipated through electrical connections 34', 36.

Referring again to FIG. 2A, formation of a second embodiment of the invention will now be described. Specifically, starting with an SOI wafer 12, 14, 16 as before, a layer of silicon nitride 22 is deposited to a thickness approximating the desired final thickness of the gate polysilicon of an active device, generally in the range of 500 to 3000 Angstroms (which is large relative to gate insulator thickness). A photoresist mask layer 26 is then deposited and patterned with openings only at the locations of the TPPs 20. The nitride layer and wafer are then etched to the back side bulk silicon, as before. The resist is then removed and another resist mask formed with openings at the gate active regions and the nitride layer is etched through to the SOI wafer surface of the active silicon layer.

An insulator (generally oxide) 24' is then deposited or preferably grown to the thickness desired for the gate insulator to simultaneously form the gate insulator and the insulator layer within the TPP openings. (If it is desired to open the insulator at the bottoms of the TPP openings as in FIG. 1A, another mask and etch process must be performed at this point.) Then polysilicon 20, 20' is deposited to fill the TPP openings which also fills the remainder of the gate openings in the nitride layer, The polysilicon layer is then planarized (e.g. by polishing to the nitride layer) to complete the structure shown in FIG. 2A and establish the thickness of the gate polysilicon in accordance with the thickness of the nitride layer polish stop (e.g. the thickness of the nitride layer less the thickness of the gate insulator).

However, in either of the first or second embodiments of the invention, passivation layer 40 would limit thermal transfer to a heat sink which may be directly applied thereon. (The embodiment of FIG. 2 also does not provide any structure which would facilitate the attachment of a heat sink thereto.) Generally, the passivation layer would be made thicker if such a heat sink is to be applied in order to provide sufficient mechanical isolation of the heat sink from the active devices and wiring to avoid damage from accelerations which may be communicated from the heat sink and to avoid electrical contact of the wiring layers therewith. Therefore, there is a significant trade-off between passivation layer thickness and heat sink efficiency (and necessary mass). There is also a trade-off between the efficiency of heat transfer from the front of the chip (whether or not a heat sink is employed) and the number of wiring layers that can be provided to connect the active devices.

Figure 3:
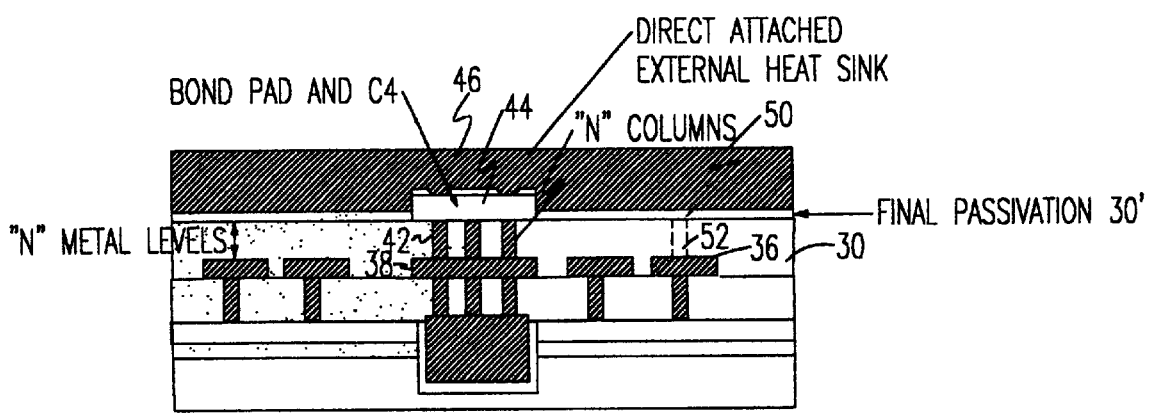
FIG. 3 is a cross-sectional view of a third embodiment of the invention in which the structure of the first embodiment of FIG. 2 is made compatible with a passive heat sink or active cooling device.

These trade-offs can be avoided by the expedient which will now be explained with reference to a third embodiment of the invention shown in FIG. 3. It should be understood that the layer 30, as illustrated, can provide any desired number of wiring layers of conductors such as 36 embedded in and separated by any desired number of insulator layers followed by a final passivation layer 30'. It should be similarly understood that bond pads 50 and via connections 52 to connections 36 or other wiring layers in layer 30 must also be made.

To provide increased heat transfer from metal layer 38, in accordance with the invention, layer 30 is further patterned to layer 38 and a plurality of metal vias/studs 42 (or, alternatively a single, larger via/stud) formed therein in a process similar to that described above, using a resist, suitably exposed and developed. It should also be appreciated that this patterning and via/stud formation operations are also "free" processes if bond pads and vias are formed to connections 36 in the same plane as pad 38. Otherwise, different patterning and etching processes must be employed followed by a common metallization step (or different metallization steps if different materials and/or structures are to be formed for pads 44 and 50, respectively. The final passivation layer 30' is also patterned (before or after the patterning for vias/studs 42; the latter being preferred) and a metal pad 44 is formed.

The process for formation of the metal pad 44 generally corresponds to the metal, metals and/or alloys chosen for the pad and whether or not the pad is to have a layered structure, as will be evident to those skilled in the art. Metal pad 44 thus provides a convenient structure for attachment of a passive heat sink or active cooling arrangement (e.g. a liquid or gas cooled cold plate). For example, the metal pad 44 may be a layered structure of copper and a tin/lead alloy to facilitate attachment of the heat sink 46 by soldering. Alternatively, for aluminum or tungsten pads 44 a thermal paste and a mechanical arrangement would be used for attachment of the heat sink. Thus, the embodiment of the invention shown in FIG. 3 provides further enhancement to power dissipation from the front side of the chip, increased efficiency of any heat sink or active cooling arrangement employed and a convenient structure for attachment of the heat sink.

Figure 4:
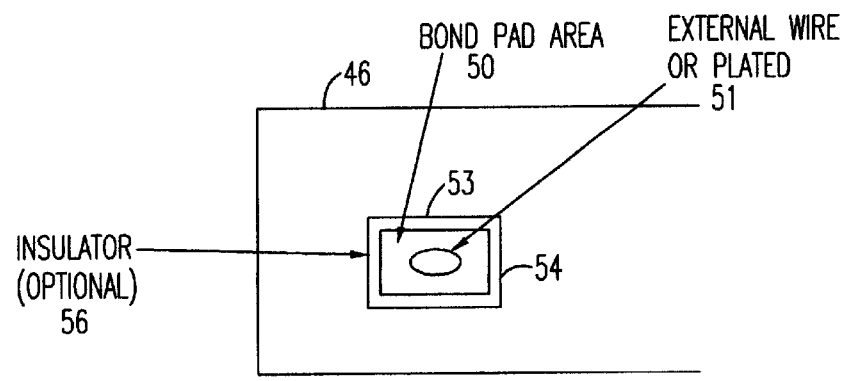
FIG. 4 is a plan view of a portion of a passive heat sink or active cooling device showing formation of a preferred form of a bond hole therein in accordance with the invention.

Referring now to FIG. 4, it should be understood that the heat sink or active cooling arrangement must generally accommodate electrical connections to the front surface of the chip. However, other techniques are available, such as edge connections, for providing electrical connections to other chip locations where no potential for interference with a heat sink would be presented.

Where connections to the front surface of the chip are desired and bond pads 50 and connection vias 52 correspondingly provided, it is preferred to provide an aperture 54 in the heat sink 46, an exemplary and preferred form of which is shown in plan view in FIG. 4. The opening 54 should be slightly larger than the bond pad 50 and provide clearance 53 around a bonded (e.g. welded) wire 51 connection to the bond pad. An insulator 56 can be provided within aperture 54, if desired.

The aperture thus provided does not generally reduce the efficiency of the heat sink as described above since the aperture will increase the area of the heat sink and the insulator 56, if used, may be this and may not significantly reduced power dissipation from the heat sink. It should also be recalled that some heat is radiated from the bond pad 50 and the wire connection bonded thereto and heat may be transferred from the bonded wire and bond pad to the heat sink by radiation may be increased by the presence of the heat sink, as well.

In view of the foregoing, it is clear that the invention, in both embodiments described above, provides significant supplemental heat transfer from an integrated circuit chip and particularly from the front side thereof and consistent with increasing heat transfer to the bulk silicon handling layer 12 in a SOI integrated circuit. The formation of the heat transfer structures in accordance with the invention are accomplished with simple, well-understood and high yield processes which may be carried out simultaneously and in the same operation as other processes required for fabricating the chip.

The heat transfer structures in accordance with the invention do not require any additional area beyond that required for the TPP structures of the invention disclosed in the above-incorporated application. The inclusion of the invention in combination with TPP structures also provides for power dissipation required by highest levels of performance and greatest density of integration while limiting the size of TPP structures required and avoiding trade-offs between power dissipation requirements and chip functionality and performance. Further, the additional thermally conducting paths provided by the invention increase the conduction of heat through the chip allowing greater control of heat distribution and temperature regulation across the chip to limit local temperature excursions in the chip.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A method of fabricating a semiconductor device having increased heat dissipation properties, said method including the steps of
   forming a recess in a substrate, said substrate having a thermal barrier therein, said recess extending through said thermal barrier and into thermally conductive material of said substrate underlying said thermal barrier,
   forming an electrical insulator in said recess, said electrical insulator in said recess having less thermal resistance than said thermal barrier,
   filling said recess with a thermally conductive material to form a plug,
   forming an active devices at a surface of said substrate adjacent said plug,
   applying an insulator layer over said active device and said plug, and
   forming a thermally conductive path from said plug through said insulator layer to a surface of said insulator layer.

2. A method as recited in claim 1, wherein said thermal barrier is an insulator layer of a silicon-on-insulator structure.

3. A method as recited in claim 2 including the further step of
   forming a pad in thermal contact with said thermally conductive path.

4. A method as recited in claim 3, including the further steps of
   forming a further insulating layer over said insulator layer,
   forming a passivation layer over said further insulating layer,
   forming a further thermally conductive path through said further insulating layer, and
   forming a further pad in an opening in said passivation layer and in contact with said further thermally conductive path.

5. A method as recited in claim 4, including the further step of
   attaching one of a passive heat sink and an active cooling device to said further pad.

6. A method as recited in claim 5, wherein said attaching step is performed by soldering.

7. A method as recited in claim 5, wherein said attaching step is performed using a thermally conductive paste.

8. A method as recited in claim 5, including the further step of
   bonding a connection wire to a bond pad formed at a surface of one of said further insulator layer and said passivation layer, said connection wire passing through an aperture in said one of said passive heat sink and said active cooling device.

9. A method as recited in claim 1, wherein said step of forming an electrical insulator includes depositing an insulator layer on an interior of said recess.

10. A method as recited in claim 9, including the further step of opening said insulator layer in said recess at a bottom of said recess.

11. A method as recited in claim 10, including the further steps, in sequence, of
    forming an opening in a polish stop layer on a surface of said substrate a location of said active device,
    forming a gate oxide on said substrate and in said opening in said polish stop layer,
    performing to simultaneously fill said opening and said recess said filling step, and
    planarizing material deposited in said filling step to said polish stop layer.

12. A method as recited in claim 9, including the further steps, in sequence, of
    forming an opening in a polish stop layer on a surface of said substrate a location of said active device,
    forming a gate oxide on said substrate and in said opening in said polish stop layer,
    performing said filling step to simultaneously fill said opening and said recess; and
    planarizing material deposited in said filling step to said polish stop layer.

13. A method as recited in claim 1 including the further step of
    forming a pad in thermal contact with said thermally conductive path.

14. A method as recited in claim 13, including the further steps of
    forming a further insulating layer over said insulator layer formed over said active devices and said plug,
    forming a passivation layer over said further insulating layer, forming a further thermally conductive path through said further insulating layer, and forming a further pad in an opening in said passivation layer and in contact with said further thermally conductive path.

15. A method as recited in claim 14, including the further step of attaching one of a passive heat sink and an active cooling device to said further pad.

16. A method as recited in claim 15, wherein said attaching step is performed by soldering.

17. A method as recited in claim 15, wherein said attaching step is performed using a thermally conductive paste.

18. A method as recited in claim 15, including the further step of bonding a connection wire to a bond pad formed at a surface of one of said further insulator layer and said passivation layer, said connection wire passing through an aperture in said one of said passive heat sink and said active cooling device.

* * * * *